(12) United States Patent
Fritze et al.

(10) Patent No.: US 6,934,007 B2
(45) Date of Patent: Aug. 23, 2005

(54) METHOD FOR PHOTOLITHOGRAPHY USING MULTIPLE ILLUMINATIONS AND A SINGLE FINE FEATURE MASK

(75) Inventors: Michael Fritze, Acton, MA (US); Brian Tyrrell, Pawtucket, RI (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/447,844

(22) Filed: May 29, 2003

(65) Prior Publication Data

US 2003/0223050 A1 Dec. 4, 2003

Related U.S. Application Data

(60) Provisional application No. 60/383,972, filed on May 29, 2002.

(51) Int. Cl.$^7$ .................. G03B 27/42; G03B 27/74; G03B 27/70; G03C 5/00
(52) U.S. Cl. ............... 355/53; 355/68; 355/67
(58) Field of Search .................. 355/53, 77, 71, 355/67, 68; 430/322, 5, 313, 312, 270.11; 438/286, 301; 716/21

(56) References Cited

U.S. PATENT DOCUMENTS

| | | | |
|---|---|---|---|
| 5,415,835 A | | 5/1995 | Brueck et al. |
| 5,539,568 A | | 7/1996 | Lin et al. |
| 5,635,316 A | * | 6/1997 | Dao .................. 430/5 |
| 5,766,829 A | | 6/1998 | Cathey, Jr. et al. |
| 5,815,247 A | | 9/1998 | Poschenrieder et al. |
| 6,184,151 B1 | | 2/2001 | Adair et al. |
| 6,296,987 B1 | | 10/2001 | Lin et al. |
| 6,479,196 B2 | | 11/2002 | Levenson |
| 6,534,242 B2 | * | 3/2003 | Sugita et al. .......... 430/312 |
| 6,553,562 B2 | | 4/2003 | Capodieci et al. |
| 6,563,566 B2 | | 5/2003 | Rosenbluth et al. |
| 2002/0036762 A1 | | 3/2002 | Nishi |
| 2002/0045136 A1 | | 4/2002 | Fritze et al. |
| 2003/0123039 A1 | * | 7/2003 | Yen et al. .................. 355/68 |
| 2003/0170565 A1 | * | 9/2003 | Eurlings et al. ....... 430/270.11 |

FOREIGN PATENT DOCUMENTS

| | | |
|---|---|---|
| EP | 0 997 781 A1 | 10/1999 |
| EP | 1 091 252 A2 | 9/2000 |

OTHER PUBLICATIONS

"0.11 um Imaging in KrF Lithography Using Dipole Illumination," Eurlings et al. *Lithography for Semiconductor Manufacturing II*. 2001. vol. 4404.

"Model Assisted Double Dipole Decomposition," Torres et al. *Optical Microlithography XV*. 2002. vol. 4691.

"Dipole Decomposition Mask–Design for Full Chip Implementation at the 100nm Technology Node and Beyond," Hsu et al. *Optical Microlithography XV*. 2002. vol. 4691.

"Phase Phirst! An Improved Strong–PSM Paradigm," Levenson et al. *20$^{th}$ Annual BACUS Symposium on Photomask Technology*. 2001. vol. 4186.

"Optimization of Dipole Off–Axis Illumination by 1$^{st}$–Order Efficiency Method for Sub–120 nm Node with KrF Lithography," Kim et al. *Jpn. J. Appl. Phys.* 2000. vol. 39.

"Optical Imaging Properties of Dense Phase Shift Feature Patterns," Fritze et al. *J. Vac. Sci. Technol.* 2002. vol. 20.

* cited by examiner

*Primary Examiner*—Peter B. Kim
(74) *Attorney, Agent, or Firm*—Gauthier & Connors LLP

(57) ABSTRACT

A method forms a feature pattern on a substrate by exposing the substrate, using a mask having a pattern of features thereon, with illumination having a first set of settings. The substrate is exposed a second time, using the same mask having the pattern of features thereon, with illumination having a second set of settings. The mask having the pattern of features thereon remains stationary between the two illumination exposures of the substrate.

63 Claims, 13 Drawing Sheets

METHOD FOR PHOTOLITHOGRAPHY USING MULTIPLE ILLUMINATIONS AND A SINGLE FINE FEATURE MASK

PRIORITY INFORMATION

The present patent application claims priority under 35 U.S.C. §119 from U.S. Provisional Patent Application Ser. No. 60/383,972 filed on May 29, 2002. The entire contents of U.S. Provisional Patent Application Ser. No. 60/383,972 filed on May 29, 2002 are hereby incorporated by reference.

GOVERNMENT RIGHTS NOTICE

The present invention was made with government support under Grant (Contract) Number, F19628-00-C-0002, awarded by the United States Air Force. The Government has certain rights to this invention.

FIELD OF THE PRESENT INVENTION

The present invention is directed to the photolithographic fabrication of fine features on using a fine feature mask. More particularly, the present invention is directed to a process and methodology of photolithographically fabricating fine features using multiple illuminations of a same feature mask

BACKGROUND OF THE PRESENT INVENTION

In the semiconductor industry, there is a continuing effort to increase device density by scaling device size. The workhorse patterning technology over the past several decades has been optical lithography due to its high throughput and mature infrastructure. Conventional scaling of optical lithography is growing increasingly difficult as feature sizes continue to drop further below the available exposure wavelengths ushering in an era of "subwavelength" lithography. This situation is not likely to change in the future as commercially required feature sizes are shrinking much faster that the wavelengths of new exposure tools.

Sub-wavelength lithography has been enabled by the semiconductor industry by the introduction of a variety of optical resolution enhancement techniques (RETs) including optical proximity correction (OPC), off-axis illumination (OAI) and phase shift masks (PSMs). Phase shift mask methods offer the greatest resolution enhancement potential. Although increasing resolution, these RET methods can substantially increase mask costs which are difficult to amortize over moderate to low volume wafer production runs.

It is the purpose of this invention to offer a novel method of producing dense contact features. This method will allow the cost amortization of expensive RET photomasks over moderate to low production volumes. This method will also enhance resolution and increase the process latitude of fabricating dense contact patterns that are amoung the most difficult levels to pattern in the semiconductor industry.

In order to form small-dimensioned features, a variety of phase-shifting techniques have been proposed. In some of these methods, features are defined by forming open regions in an opaque layer on a mask or reticle (referred to generally as "mask" herein). The open regions transmit substantially all radiation incident thereon. Near or surrounding these open regions are phase-shifters that also transmit some or all of the radiation incident thereon, but which shift the phase of the radiation approximately 180° relative to the openings forming the features. In this way, the radiation from the phase shifter destructively interferes with the radiation from the field regions, providing enhanced contrast at the feature's edge.

In this process, a mask, or "reticle," includes a semiconductor circuit layout pattern typically formed of opaque chrome, on a transparent glass (typically $SiO_2$) substrate. A stepper, which includes a light source and optics/lenses, projects light coming through the reticle to image the circuit pattern, typically with a 4× to 5× reduction factor, on a photo-resist film formed on a silicon wafer. The term chrome refers to an opaque masking material that is typically but not always comprised of chrome. The transmission of the opaque material may also vary such as in the case of an attenuating phase shift mask. It is further noted that the relative phase of the transmitted light may vary, as in the case of a phase shift mask.

FIG. 1 is an example of a conventional optical projection lithography apparatus. As illustrated in FIG. 1, the optical projection lithography apparatus includes a light source 20, a photomask 22, and reduction optics 24. A wafer 26, having a layer of photo-resist 28 thereon, is placed within the optical projection lithography apparatus, and the light-source 20 generates a beam of light 21 that is incident upon the photomask 22. The reduction optics 24 reduces the light beam to cause a pattern 30 that exposes the photo-resist layer 28, creating the pattern 30 of reacted material in the resist layer 28. In this manner, a pattern 32, provided on the mask 22, is transferred to the photo-resist layer 28 on the wafer 26.

The photo-resist pattern 30 is then transferred to the underlying wafer 26 through standard etching processes using standard semiconductor fabrication techniques. Both positive and negative tone resists can be used to produce either positive or negative images of the mask pattern on the wafer.

FIG. 2 is a further example of a conventional photolithography methodology. As illustrated in FIG. 2, a mask 100 comprises a first region 101, which may be referred to as the 0° phase and a second region 102 which may be referred to as the 180° phase. As shown, the second region 102 is adjacent to the first region 101 along interface 105. Intensity curve 110 shows the intensity of radiation at the image plane, I, as a fraction of the intensity incident on the mask 100, $I_0$.

As shown, the intensity 111 underneath region 101 away from the interface 105 is nearly equal to the intensity incident on region 101. Similarly, the intensity 112 underneath section 102 away from interface 105 is nearly equal to the intensity incident on region 102. However, underneath the interface 105 there is a sharp drop 115 in the intensity at the image plane due to the destructive interference between the radiation transmitted through regions 101 and 102.

The exposure conditions can be adjusted such that the portion of the photosensitive layer underneath interface 105 is substantially unexposed, while portions of the photosensitive layer under regions 101 and 102 away from interface 105 are substantially exposed. In the case of a positive photoresist layer, after exposure and development, a thin line of photoresist will remain in the region underneath interface 105, while the remainder of the photoresist layer will be removed.

In the case of a negative photoresist layer, after exposure and development, the unexposed region underneath interface 105 will be removed while photoresist under the remainder of the photosensitive layer will be hardened, and will remain after development. Thus, this conventional methodology method may be used to form a narrow line in a positive photoresist layer or a narrow opening in a negative photoresist layer.

In one conventional method, as described in U.S. Pat. No. 5,635,316 and U.S. Pat. No. 5,766,829, a photosensitive layer is exposed to a first reticle having a pattern of parallel lines defined by alternating phase regions to form a first set of parallel features. Then, the photosensitive layer is exposed to a second reticle having a pattern of parallel lines defined by alternating phase regions to form a first set of parallel features which are arranged substantially orthogonal to those features formed by the first reticle.

As a result of these two exposures, a small dimension latent image is formed at every intersection of the first and second sets of features. Finally, a third exposure is performed using a standard trim or contact mask to expose those latent images where no contacts are desired. This method can also form contact hole or pillar features depending on the resist tone used (positive for pillars, negative for contact holes).

A schematic example of simulated results of a single exposure conventional photolithographic process is further illustrated in FIGS. 3 and 4. In this simulation, a dense array of contact holes features is the desired result. FIG. 3 illustrates an example of a mask, (chromeless phase shift mask) having 180° phase region(s) 210 and a plurality of 0° phase regions 200, that can be used to exposed a substrate to realize a dense array of contact hole features. This mask, in this example, has a constant feature pitch of 250 nm.

The imaging performance of the mask of FIG. 3 was simulated for a typical conventional lithography process with a 248 nm stepper wavelength, an NA (numerical aperture) of 0.6, and annular illumination with partial coherence $\sigma_I=0.6, \sigma_O=0.8$, wherein a dense contact grid is subjected to a single exposure. The resulting image for the simulation region 220 of FIG. 3 is defined by the schematic illustration of FIG. 4. As noted below, the Figures used to in this application are not necessarily to scale, and thus, as set forth above, it is further noted that the features illustrated in FIG. 3 should be set apart by a constant feature pitch.

As illustrated in FIG. 4, the resulting image for the simulation region 220 is a plurality of areas 240 of high intensity peaking at high intensity sections 241 and a plurality of areas 200 of low intensity bottoming out at low intensity sections 201. In this simulation, the peak intensity was 0.58 $I_0$ and the minimum intensity was 0.37 $I_0$, wherein $I_0$ is the original intensity of the light incident upon the mask. Thus, the contrast of this exemplary conventional photolithographic process is 0.21 (0.58–0.37) that is relatively low for a manufacturable process.

It is further noted that in any optical lithography technique, the resulting optical image intensity is a function of the proximity of features. Contrast is lost as feature pitch values decrease. As a result, the resulting size of features located in densely populated regions can be different than the size for those features that are isolated from the densely populated features. This is known as the "optical proximity" effect.

With respect to optical proximity effect, the critical dimension of features depends on feature density. Moreover, optical proximity effects can become more severe in sub-wavelength lithography. The optical proximity effects can result in dense lines 261 and isolated line 262 on wafer 260 being printed with different sizes, even if the same size on the mask, as illustrated in FIG. 10, or dense contacts 263 and isolated contact 264 on wafer 260 being printed with different sizes, even if the same size on the mask, as illustrated in FIG. 11. Since the performance and yield of the circuit depends on the size and size tolerance of the gates and contacts, this is an undesirable result.

Spatial frequency effects are caused by the "low-pass filter" behavior of a projection lithography lens wherein high spatial frequencies do not pass through the lens. This results in corner rounding and line end shortening. An example of this effect is illustrated in FIG. 12. As illustrated in FIG. 12, a desired image is represented by mask 2200, but the actual image pattern 265 on the wafer is shortened and rounded.

To compensate for optical proximity and spatial frequency effects, additional features have been conventionally introduced on the mask that can involve both printable as well as sub-resolution elements. In these methods, extra features such as serifs, mousebites, hammerheads, and scattering bars are added to the mask features in order to correct for optical proximity effects and other spatial frequency effects. These conventional methods involve sophisticated algorithms with very large data size, as different corrections are required for each separation distance between the features. For this reason, conventional feature size correction ("OPC" or optical proximity correction) is a costly and time-consuming process. Such methods also add substantial mask fabrication complexity. This can lower mask yield and increase mask cost.

Notwithstanding, the conventional methods described above present various drawbacks.

For example, in some of the conventional methods described above, which use a crossed double exposure of two phase shift grating masks to make contact arrays, the process requires the moving in and out of two different masks or reticles of the optical path or one mask requiring rotation between exposures to produce a two-dimensional pattern prior to the trimming process. This requirement of two different masks or one rotating mask introduces alignment problems into the photolithographic process that must be overcome.

Furthermore, the use the two different masks or one rotating mask to produce a two-dimensional pattern prior to trimming introduces a significant time delay between exposures so as to allow the precise alignment the masks or rotated mask prior to exposure.

In the conventional method described above, which uses a phase shift mask requiring only one exposure to make the dense contact array, the conventional process results in very low contrast for the dense contact features.

Lastly, the conventional methodologies, as described above, often utilize annular or other types of off-axis illumination that provides insufficient contrast for very dense contact features.

Therefore, it is desirable to provide a photolithographic process that can produce dense two-dimensional features without introducing alignment problems or significant time delays in the fabrication process. Furthermore, it is desirable to provide a photolithographic process that provides enhanced contrast properties.

Moreover, it is desirable to develop an imaging method that can produce dense two-dimensional features without introducing alignment problems or significant time delays in the fabrication process while mitigating optical proximity and spatial frequency effects without adding complex optical proximity correction features to the mask, while preserving the resolution enhancement aspects required by sub-wavelength lithography.

SUMMARY OF THE PRESENT INVENTION

One aspect of the present invention is a method of forming a feature pattern on a substrate. The method exposes the substrate, using a mask having a pattern of features thereon, with illumination having a first set of settings and exposes the substrate, using the same mask having the pattern of features thereon, with illumination having a second set of settings.

A second aspect of the present invention is a method for defining multiple fine features in a resist. The method exposes the substrate, using a mask having a pattern of features thereon, with illumination having a first set of settings; exposes the substrate, using the same mask having the pattern of features thereon, with illumination having a second set of settings; and sub-threshold exposes the substrate using a gray-tone mask to locally partially expose different regions of the substrate, thereby allowing for a range of critical dimensions to be defined by the feature definition exposure.

A third aspect of the present invention is a method of forming a feature pattern on a substrate. The method exposes the substrate, using a mask having a pattern of features thereon, with X-dipole illumination and exposes the substrate, using the same mask having the pattern of features thereon, with Y-dipole illumination.

A fourth aspect of the present invention is a method for defining multiple fine features in a resist. The method exposes the substrate, using a mask having a pattern of features thereon, with X-dipole illumination; exposes the substrate, using the same mask having the pattern of features thereon, with Y-dipole illumination; and sub-threshold exposes the substrate using a gray-tone mask to locally partially expose different regions of the substrate, thereby allowing for a range of critical dimensions to be defined by the feature definition exposure.

A fifth aspect of the present invention is a method for photolithographically forming a wide range of useful patterns. The method illuminates a same template mask multiple times. Each exposure of the same template mask has different illumination parameters.

A sixth aspect of the present invention is a method of forming a feature pattern on a substrate. The method exposes the substrate, using a mask having a pattern of features thereon, with illumination from an illuminator; adds a phase shifter to the illuminator; and exposes the substrate, using the same mask having the pattern of features thereon, with illumination from the illuminator having the phase shifter. The phase shifter enables the pattern upon substrate to be shifted in Cartesian space with fine resolution.

Another aspect of the present invention is a method of forming an interdigitated pattern on a substrate. The method exposes the substrate, using a mask having a pattern of features thereon, with illumination from an illuminator; adds a phase shifter element to an optical path of the illuminator; and exposes the substrate, using the same mask having the pattern of features thereon, with illumination from the illuminator having the phase shifter element in the optical path thereof, the phase shifter shifting the pattern upon substrate in Cartesian space to produce the interdigitated pattern.

A further aspect of the present invention is a method of forming a feature pattern on a substrate. The method exposes the substrate, using a mask having a pattern of features thereon, with illumination from an illuminator having the phase shifter element in the optical path thereof, the phase shifter element enabling the pattern to be aligned upon a substrate in Cartesian space with fine resolution.

Another aspect of the present invention is an illuminator for a lithography apparatus. The illuminator includes a light source and illumination parameter modifying means for varying illumination parameters between subsequent exposures of a same mask.

A further aspect of the present invention is a photolithographic exposure system. The photolithographic exposure system included an illuminator, a projection optics system, and a substrate stage. The illuminator further includes a light source and illumination parameter modifying means for varying illumination parameters between subsequent exposures of a same mask.

BRIEF DESCRIPTION OF THE DRAWINGS

The present invention may take form in various components and arrangements of components, and in various steps and arrangements of steps. The drawings are only for purposes of illustrating a preferred embodiment or embodiments and are not to be construed as limiting the present invention, wherein.

DETAILED DESCRIPTION OF THE PRESENT INVENTION

Figure 1:
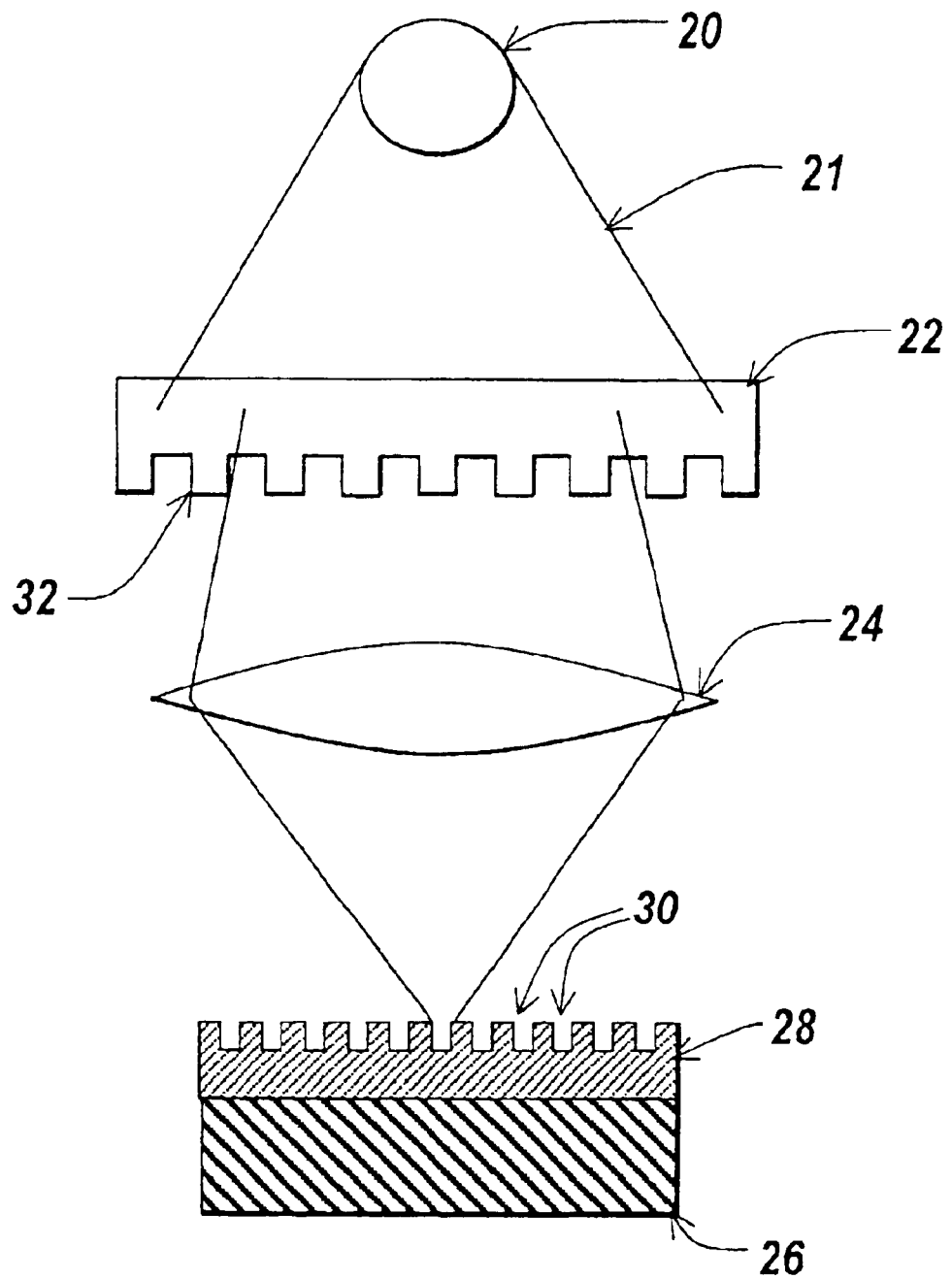
FIG. 1 is a schematic diagram of the lithography apparatus in accordance with the present invention.
Figure 2:
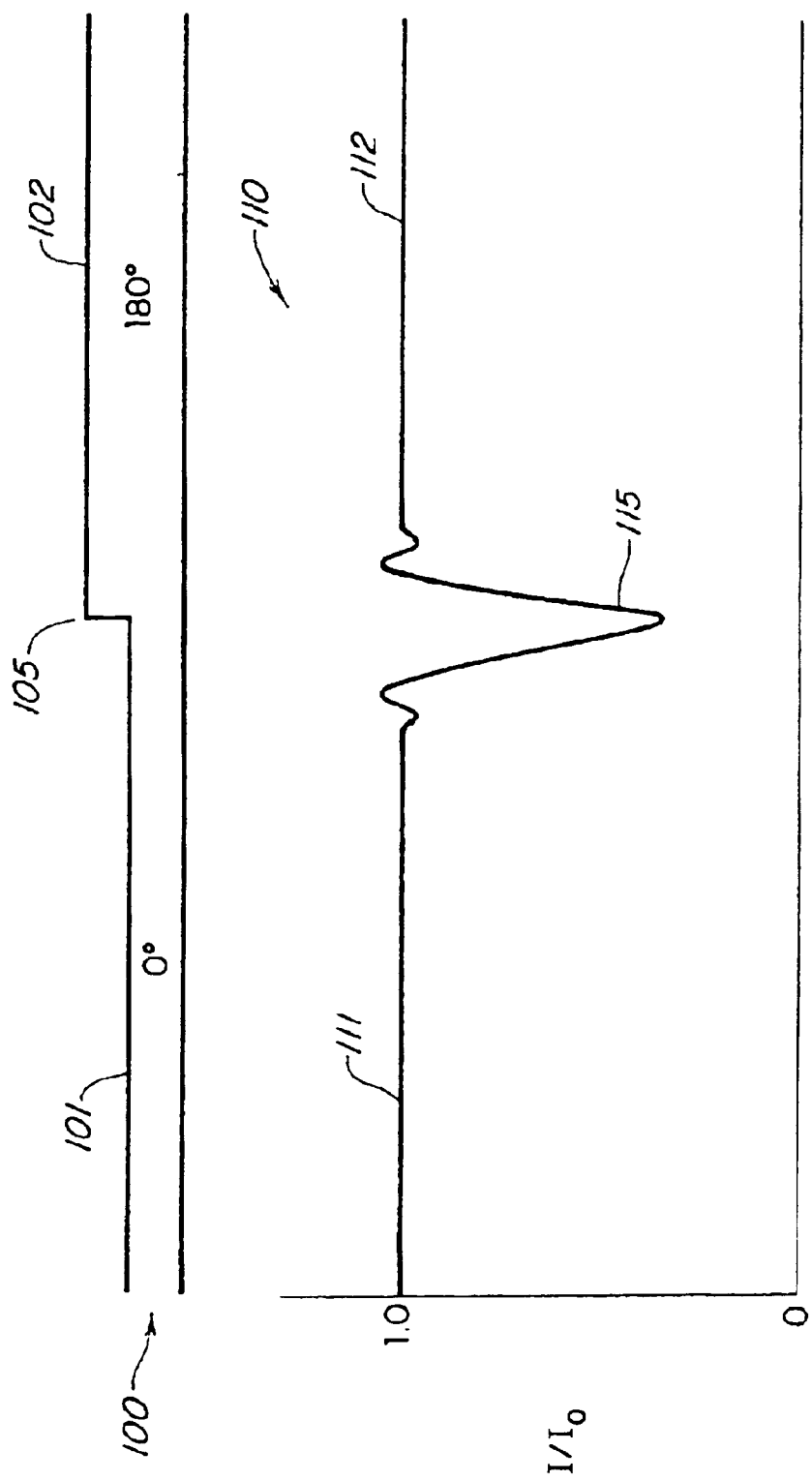
FIG. 2 is an illustration of an intensity profile obtained by phase-edge photolithography.
Figure 3:
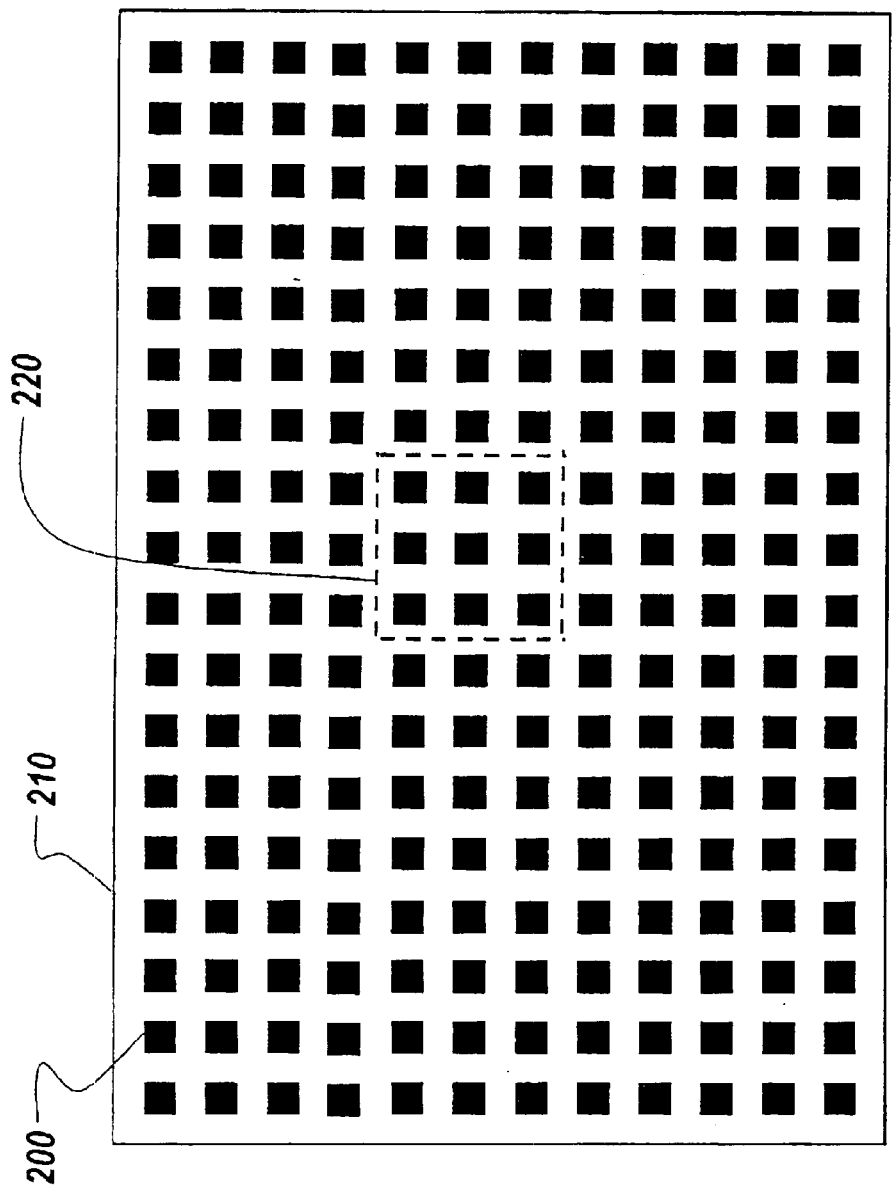
FIG. 3 is an illustration of a dense array of dense contact hole features.
Figure 4:
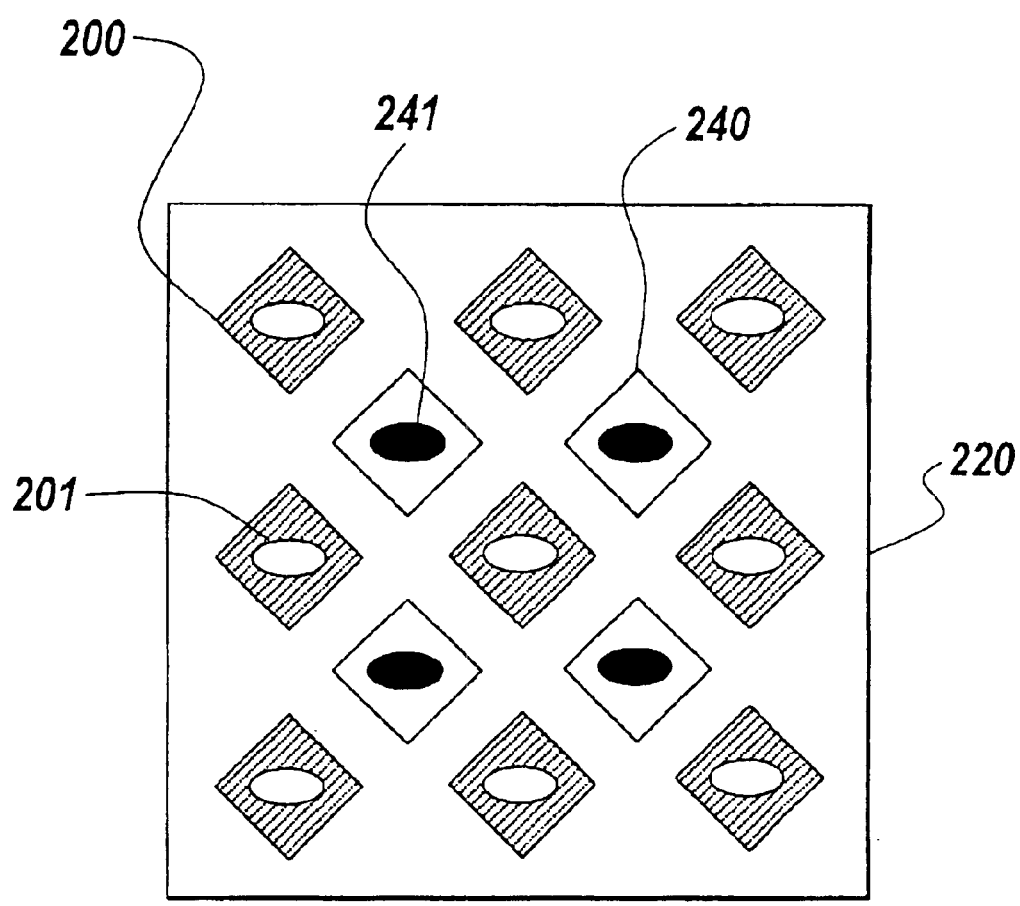
FIG. 4 is an illustration of an aerial image of a contact mask with annular illumination.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference numbering has been used throughout to designate identical or equivalent elements. It is also noted that the various drawings illustrating the present invention are not drawn to scale and that certain regions have been purposely drawn disproportionately so that the features and concepts of the present invention could be properly illustrated.

The present invention is directed to an imaging approach that overcomes the limitations of the conventional techniques, and confers a number of advantages. It addresses the problems of alignment problems or significant time delays in the fabrication process while mitigating optical proximity and spatial frequency effects without adding complex optical proximity correction features to the mask, while preserving the resolution enhancement aspects required by sub-wavelength lithography.

In the following description, the phrase, "lines," refers to either the trenches or the raised areas; e.g., plateaus; on a wafer. Moreover, the phrase, "contacts," refers to either the holes or pillars on a wafer. The described photoresists may either be a negative tone or a positive tone. The descriptions are applicable to either positive or negative imaging of the wafer or substrate.

With respect to spatial frequency effects and optical proximity effects, any image that is lithographically exposed can be thought of in Fourier space, where components of various spatial frequencies sum to form the complete image. The lens acts as a low-pass filter because it has a finite aperture. Spatial frequency effects cause corner rounding and line-end shortening because higher diffraction orders are filtered out, but the first diffraction order typically passes through the lens unfiltered. Optical proximity effects cause the same features spatially apart from each other on a substrate to realize a size differential even though these features were formed using the same mask. This effect is typically described quantitatively in terms of critical dimension versus pitch.

Lastly, the phrase, "dense features," refers to an area on the substrate having a multitude of features positioned very closely to each other.

In the present invention, a mask is provided including a dense repetitive structure of features that results in a large array of densely populated features on the film or substrate. The pattern of dense features may be locally or globally periodic. The mask is designed to print dense features near the resolution limit of the lithography stepper used, thus defining a pattern "grid." The fine features (such as transistor gates and contacts) are laid out on this grid. The allowed feature grid locations correspond to feature locations on the dense feature mask.

In this manner, only a single dense feature template is required for generating any of a number of different circuits and patterns. The re-usability of the template mask is desirable since this is often the most difficult and expensive mask to fabricate. This is especially true if the template mask is a phase-shift mask. A phase-shift mask is capable of imaging dense features very close to the Rayleigh limit for optical projection steppers. (Pitch$_{MIN}$=0.59/(NA)).

As noted above, FIG. 1 is a schematic block diagram of a conventional optical projection lithography apparatus. The conventional optical projection lithography apparatus includes a light source 20, a photomask 22, and reduction optics 24. A wafer 26 having a layer of photoresist 28 is presented to the conventional optical projection lithography apparatus, and the light-source 20 generates a beam of light 21 that is incident upon the photomask 22 and reduced by reduction optics 24 to cause a pattern 30 to be exposed in the photoresist layer 28. In this manner, a pattern 32 provided on the mask 22 is transferred to the photoresist layer 28 on the wafer 26.

Figure 9:
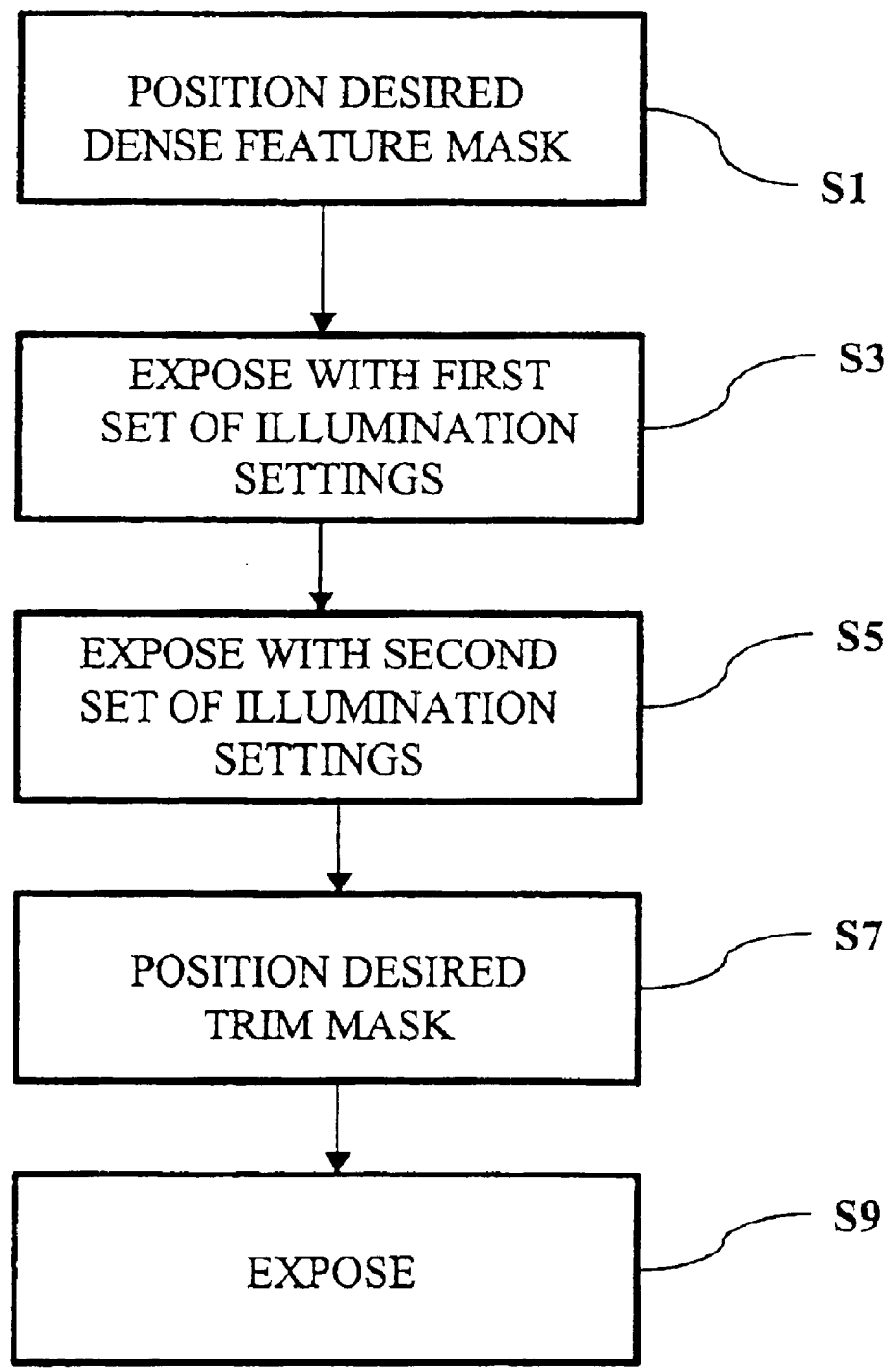
FIG. 9 is a flowchart illustrating the exposure methodology of a substrate in accordance with the concepts of the present invention.
Figure 10:
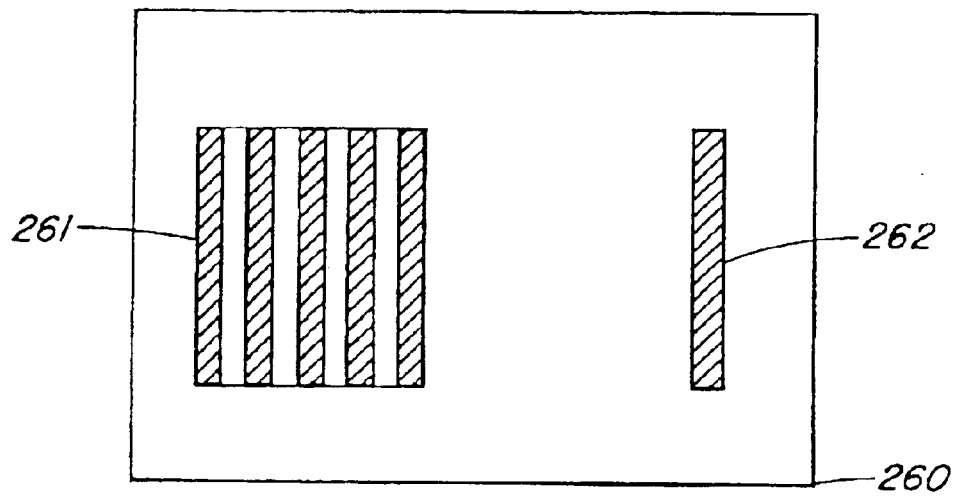
FIG. 10 is an illustration of an optical proximity effect with respect to fabricating lines.
Figure 11:
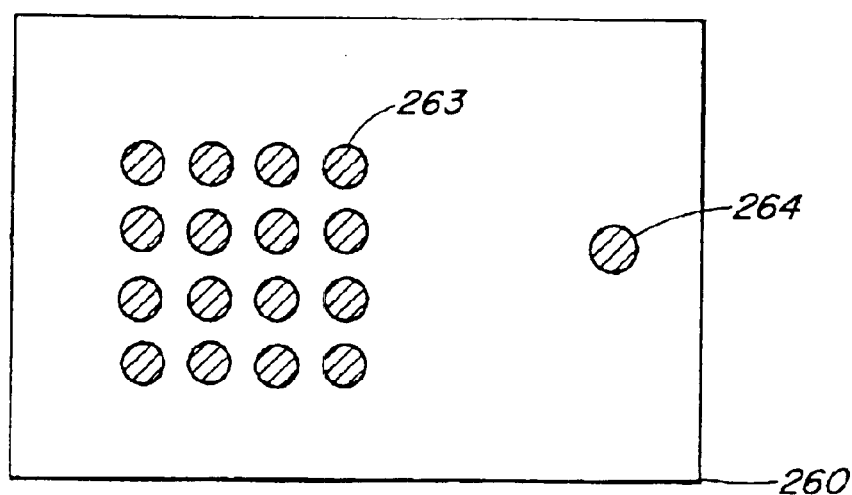
FIG. 11 is an illustration of an optical proximity effect with respect to fabricating contact holes or pillars.
Figure 12:
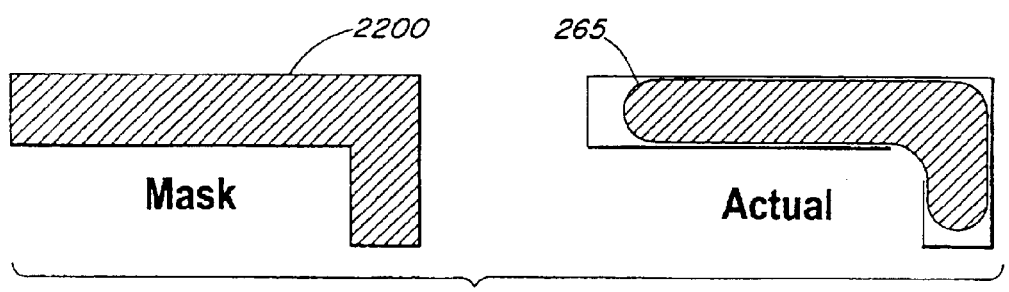
FIG. 12 is an illustration of a spatial frequency effect with respect to fabricating lines.
Figure 14:
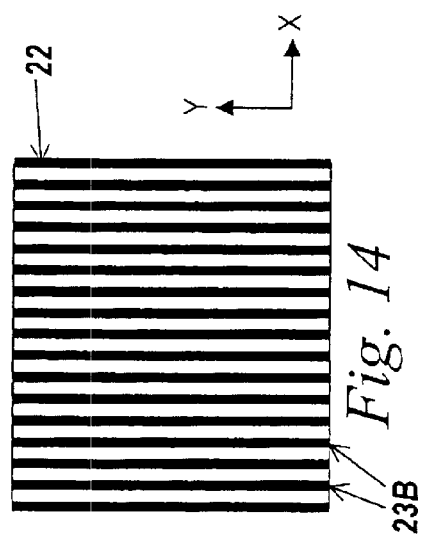
FIGS. 13–16 are top views of various dense-feature mask pattern configurations in accordance with the present invention.
Figure 16:
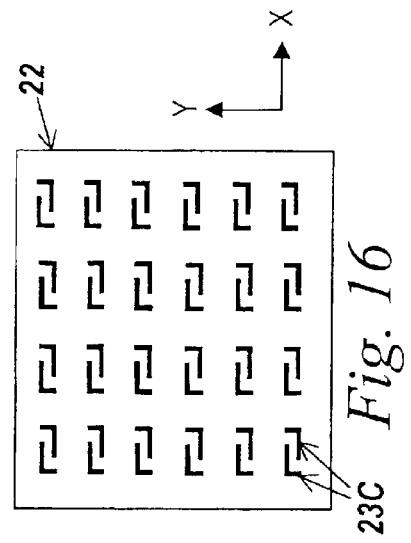

As noted above, the conventional photolithographic processes introduced alignment problems and time delays as a result of using two different masks or a rotated mask to generate dense two-dimensional image features. To address these problems, the concepts of the present invention propose modifying the properties of the illumination while maintaining the mask in a stationary position over the substrate between exposures. FIG. 9 illustrates a flowchart of this concept.

As shown in FIG. 9, the first step, S1, is to position the desired dense feature template over the substrate to be exposed or imaged. After the desired dense feature template mask is positioned over the substrate to be exposed or imaged, the substrate is exposed with a first set of illumination settings at step S3.

Figure 5:
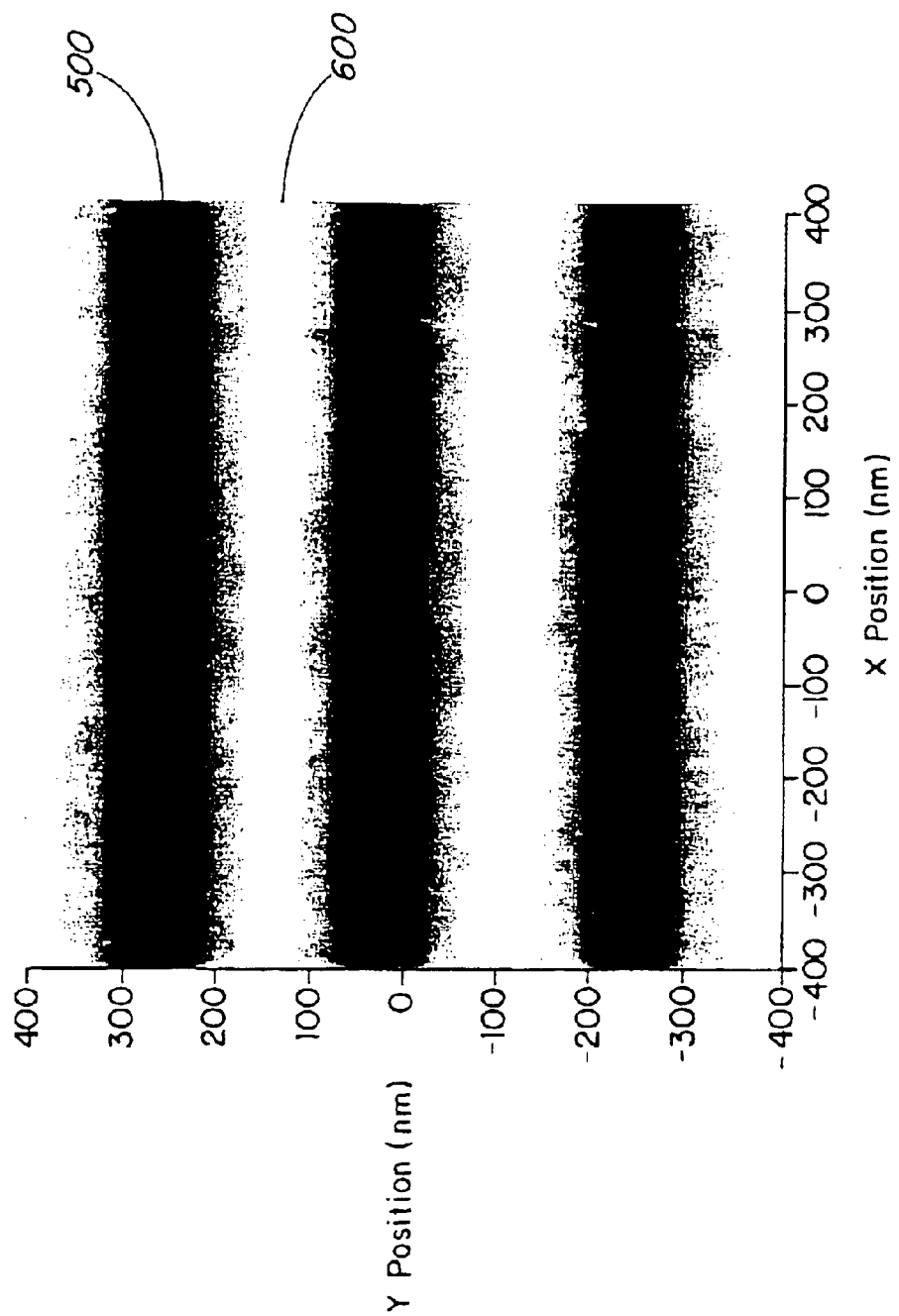
FIG. 5 is an illustration of a dense contact mask imaged by X-dipole illumination in accordance with the concepts of the present invention.

In a preferred embodiment of the present invention, the substrate is exposed by X-dipole illumination at step S3. FIG. 5 illustrates a contact mask imaged by X-dipole illumination, for one set of partial coherence and mask parameters, in accordance with the concepts of the present invention. In the example illustrated by FIG. 5, the X-dipole illumination having a partial coherence of $\sigma_I/\sigma_O$=0.3/0.8 produces an image that has a constant intensity along a Y position on the mask and has an intensity that periodically varies in value in a substantially discrete manner between a normalized maximum intensity 0.75 (600) and a normalized minimum intensity of 0.26 (500) along an X position on the mask, resulting in a normalized contrast value of 0.49. Moreover, in the example illustrated by FIG. 5, the relevant mask parameters are a pattern of 250 nm pitch chromeless phase shift contacts, and the relevant stepper parameters are a 248 nm wavelength and NA=0.6.

It is noted that the normalized contrast values of the Figures are for illustrative purposes only and do not imply anything about the achievable contrast using the method according to the concepts of the present invention.

The mask remains at its current position. The mask is not rotated, and the mask is not swapped out so that a new mask having a different orientation is positioned over the substrate to be exposed or imaged.

Using the same mask (in the same orientation), at step S5, the substrate is exposed with a second set of illumination settings, the second set of illumination settings being different from the first set of illumination settings.

Figure 6:
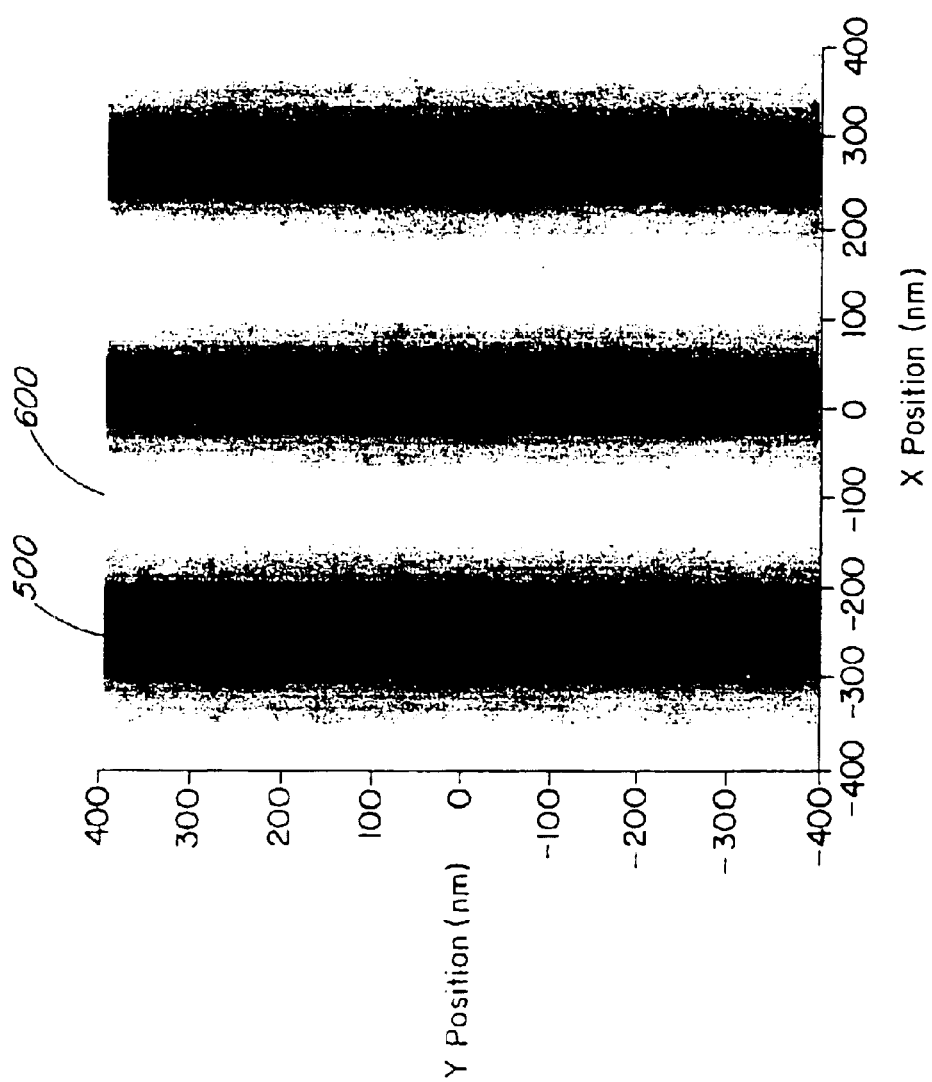
FIG. 6 is an illustration of a dense contact mask imaged by Y-dipole illumination in accordance with the concepts of the present invention.

In a preferred embodiment of the present invention, the substrate is exposed by Y-dipole illumination at step S5. FIG. 6 illustrates a contact mask imaged by Y-dipole illumination, for one set of partial coherence and mask parameters in accordance with the concepts of the present invention. As shown in FIG. 6, the Y-dipole illumination having a partial coherence of $\sigma_I/\sigma_O$=0.3/0.8 produces an image that has a constant intensity along an X position on the mask and has an intensity that periodically varies in value in a substantially discrete manner between a normalized maximum intensity 0.75 (600) and a normalized minimum intensity of 0.26 (500) along a Y position on the mask, resulting in a normalized contrast value of 0.49. Moreover, in the example illustrated by FIG. 6, the relevant mask parameters are a pattern of 250 nm pitch chromeless phase shift contacts, and the relevant stepper parameters are a 248 nm wavelength and NA=0.6.

Figure 7:
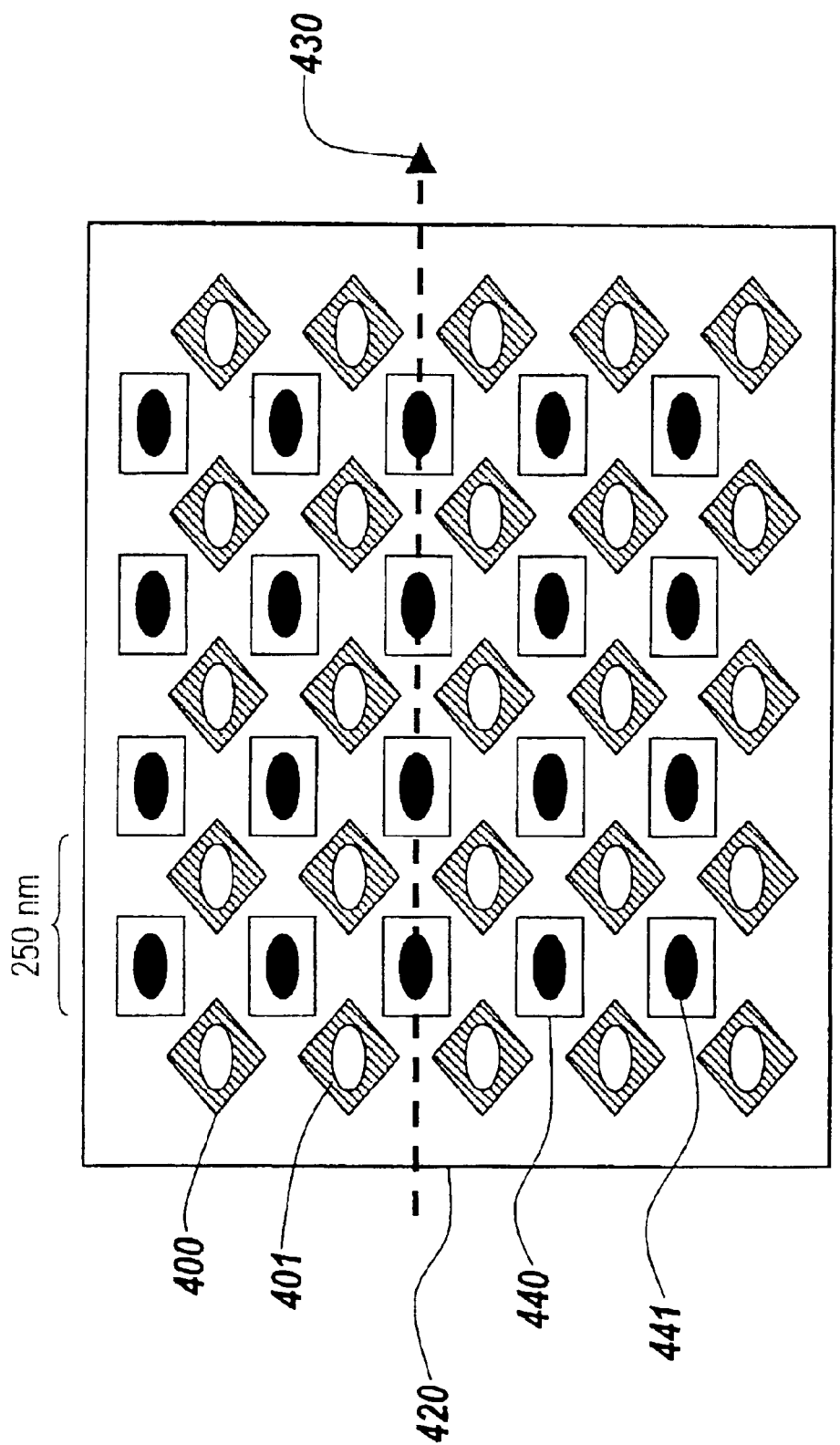
FIG. 7 is a simulation of the exposure illumination intensities that are experienced by a substrate or contact mask as a result of a double exposure summing of an X-dipole illumination and a Y-dipole illumination in accordance with the concepts of the present invention.

Upon completion of step S5, the substrate has imaged thereon a pattern of dense two-dimensional features, such as potential contacts. FIG. 7 illustrates a simulation 420 of the exposure illumination intensities that are experienced by a substrate or contact mask as a result of a double exposure of an X-dipole illumination having a partial coherence of $\sigma_I/\sigma_O=0.3/0.8$ and a Y-dipole illumination having a partial coherence of $\sigma_I/\sigma_O=0.3/0.8$, in accordance with the concepts of the present invention. Moreover, in the example illustrated by FIG. 7, the relevant mask parameters are a pattern of 250 nm pitch chromeless phase shift contacts, and the relevant stepper parameters are a 248 nm wavelength and NA=0.6.

As shown in FIG. 7, the double exposure of an X-dipole illumination and a Y-dipole illumination produces a dense pattern of illumination intensity areas (440 and 400) that two-dimensionally periodically varies in value in a substantially discrete manner between a normalized maximum intensity of 0.75 (401) and a normalized minimum intensity of 0.26 (441).

Figure 8:
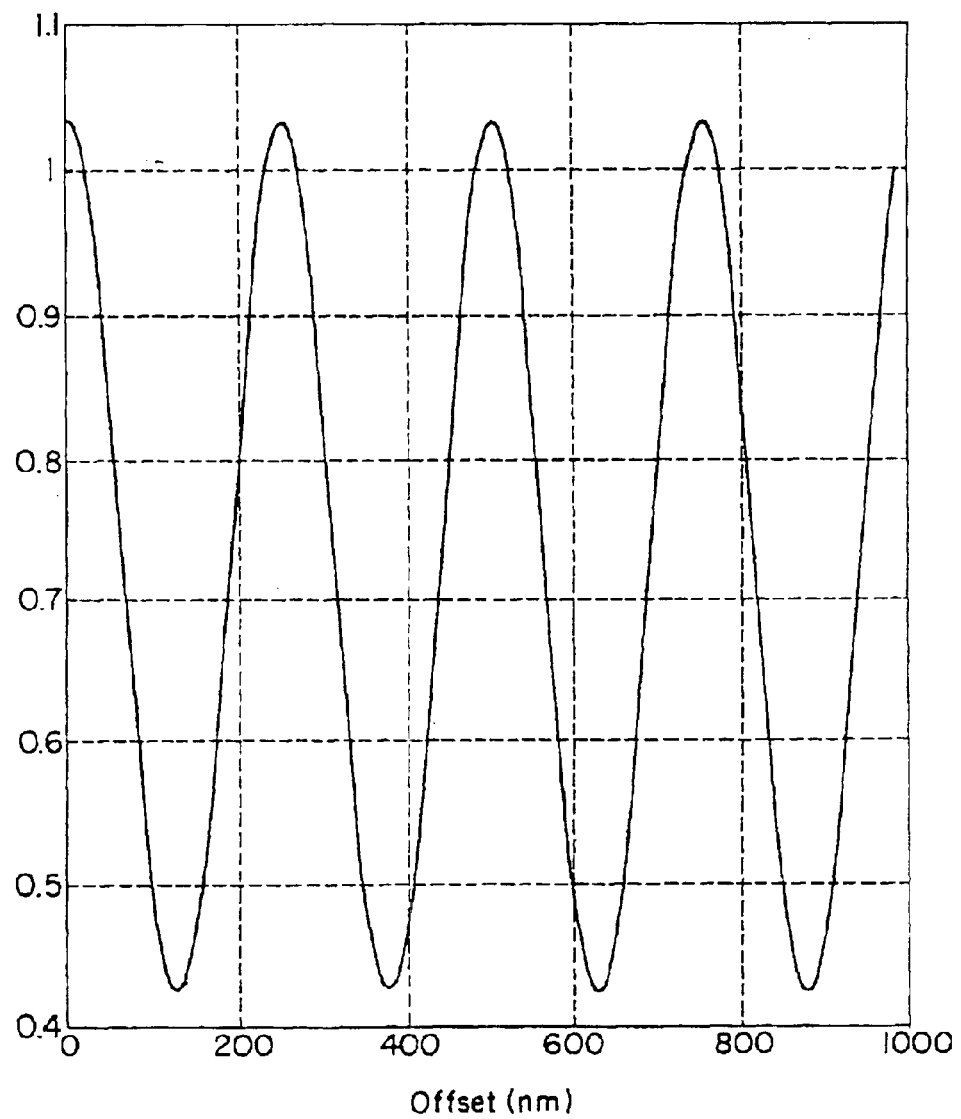
FIG. 8 is an illustration of aerial image intensities of the resulting image of FIG. 7 in accordance with the concepts of the present invention.

FIG. 8 illustrates another perspective of the results of the double exposure of an X-dipole illumination and a Y-dipole illumination in accordance with the concepts of the present invention. More specifically, FIG. 8 illustrates image intensities normalized along a X-direction (430 of FIG. 7). As can be seen from this graphical illustration, the double exposure of an X-dipole illumination and a Y-dipole illumination in accordance with the concepts of the present invention produces a varying intensity pattern having a pitch of about 250 nm. This enables the present invention to produce dense feature patterns, such as contacts, using a single dense feature mask, which is not moved or rotated between exposures; only the illumination settings are changed between exposures.

The imaged pattern can, optionally, be modified to remove any unwanted features. In such a situation, a trim mask can then be positioned over the substrate to be exposed or imaged at step S7. Thereafter, the trim mask and substrate are exposed at step S9 to remove any unwanted features.

In the example set forth above, the different illuminations correspond to a X-dipole illumination and a Y-dipole illumination; however, these differences in the illuminations are not restricted to dipole illumination differences. More specifically, examples of various differences in illumination are, but are not limited to, illuminator aperture design, illumination wavefront magnitude, illumination wavefront phase, illumination wavefront partial coherence, illumination wavelength, and/or illumination polarization.

In a preferred embodiment of the present invention, the dense-feature mask 22 is a phase-shift mask comprising a pattern of periodic features. The phase-shift mask 22 may be formed of, for example, fused $SiO_2$. Periodic trenches can be are formed in the mask 22 to provide an interference pattern upon illumination that results in the desired photoresist pattern on the wafer or substrate. The present invention is also applicable to other types of phase-shift masks such as alternating aperture (AAPSM) or attenuating phase-shifters (APSM).

An attenuating phase shift mask (APSM) is a phase shift mask in which there are multiple regions. A set of regions is included for which there is a relative phase shift of zero degrees and a transmissivity between zero and one. Other sets of regions have a phase shift typically of about 180 degrees and a transmissivity between zero and one. In some applications, attenuating phase shift masks with phase shifts between zero and ±180 degrees may be used.

Figure 13:
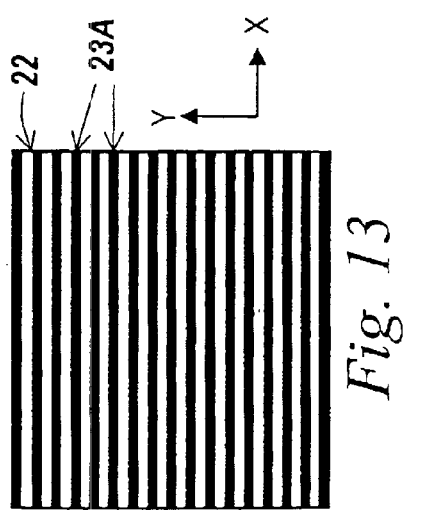
Figure 15:
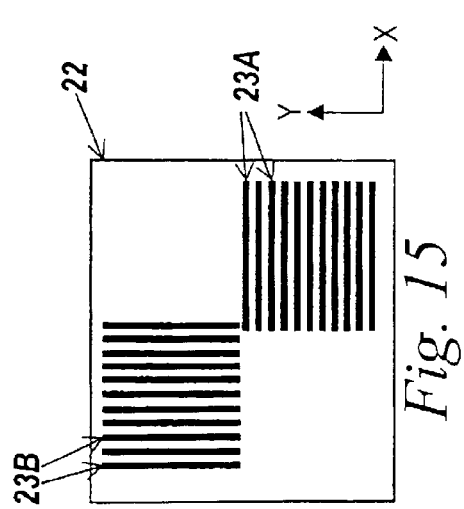

Moreover, the present invention can be utilized with a variety of masks such as illustrated in FIGS. 13–16. With reference to FIGS. 13–16, the line features 23A, 23B, and 23C can be formed in a variety of configurations. In the configuration of FIG. 13, horizontal line features 23A are formed parallel to each other in the X-direction, while in FIG. 14, vertical line features 23B are formed parallel to each other in the Y-direction. The mask shown in FIG. 15 includes features formed in a horizontal orientation 23A in a first region of the mask 22 and features formed in a vertical orientation 23B in a second region of the mask 22.

Note, however, that in alternative embodiments, the features may be formed in other patterns, including locally regular patterns. For example, in the mask of FIG. 16, a unique feature pattern 23C is employed. Other such unique combinations of patterns are applicable to the present invention.

Moreover, if a standard dense feature mask is used to generate the dense features pattern with a given critical dimension, the present invention is immune to optical proximity effects. More specifically, assuming the original dense feature mask has a more complex pattern, such as the "L"-shaped pattern 23C of FIG. 16, as these features become small, sharp features, such as corners and line-ends tend to become distorted. For this reason, various forms of simple optical proximity correction or spatial frequency correction features may be configured directly into the dense feature mask template in order to pre-distort the template pattern. For example, well-known techniques such as hammerheads, serifs, and mouse bites may be added to the corner features so that the exposed final feature resembles the desired feature. By incorporating the optical proximity correction and/or spatial frequency correction directly in the dense feature mask, the standard features are automatically corrected on the dense feature mask rather than on the design-specific trim mask and interconnect mask, thereby providing an economically efficient solution to the optical proximity correction issue.

As contemplated by the present invention, it is noted that by combining the concepts of the present invention with conventional optical proximity and spatial frequency correction techniques, economical solutions to many lithography problems may be devised. For example, one potential economic benefit of the present invention is the decreased nonrecurring cost of the mask. In other words, the present invention provides the advantage in mask cost amortization.

Furthermore, the present invention can also be utilized with a dense feature mask having sub-resolution gratings. In this embodiment, printable features of the dense feature mask, when double exposed using dipole illumination, result in fine features formed on the wafer, while the sub-resolution features of the phase-shift mask result in solid patterns on the wafer. Through the use of a trim mask, these solid patterns can be trimmed appropriately so as to form interconnects between the trimmed fine features.

Also, the present invention can produce dense one-dimensional arrays, useful for generating device gate patterns, by utilizing a single dense two-dimensional fine feature array and a single dipole illumination.

An alternative embodiment of the present invention may use either a grating mask or a general mask, which is exposed with various illuminator settings to selectively create either a negation or modulation of features occurring in frequency space. For a grating mask example, this allows the resulting grating pattern to be controllably shifted in Cartesian space with good position precision with respect to the substrate origin. This is a useful capability when decomposing a pattern into multiple exposures.

More specifically, as an example of this alternative embodiment of the present invention, a phase shifter can be added to one of the elements of the illuminator or added to the optical path of the illuminator. The addition of the phase shifter enables the pattern to be shifted in Cartesian space with fine precision. This is particularly important in applications directed to the fine or precise alignment of the exposure pattern. The alignment can be controlled without physically moving the mask or wafer, thereby enabling a finer resolution of positioning of the pattern upon the substrate being exposed. Interdigitated patterns can also be formed by using custom illumination (with phase shifter) to shift the pattern between $1^{st}$ and $2^{nd}$ exposures.

More specifically, in this alternative embodiment, the addition of the phase shifter in the illuminator in combination with a single exposure provides a controlled shift of image, which is useful for precise alignment. On the other hand, the addition of the phase shifter in the illuminator in combination with a double exposure provides a controlled image shift that can produce interdigitated patterns to increase printable pattern density. Thus, the addition of the phase shifter, in this embodiment of the present invention, provides two benefits, precise alignment or increased printable pattern density, depending upon the exposure environment.

Figure 17:
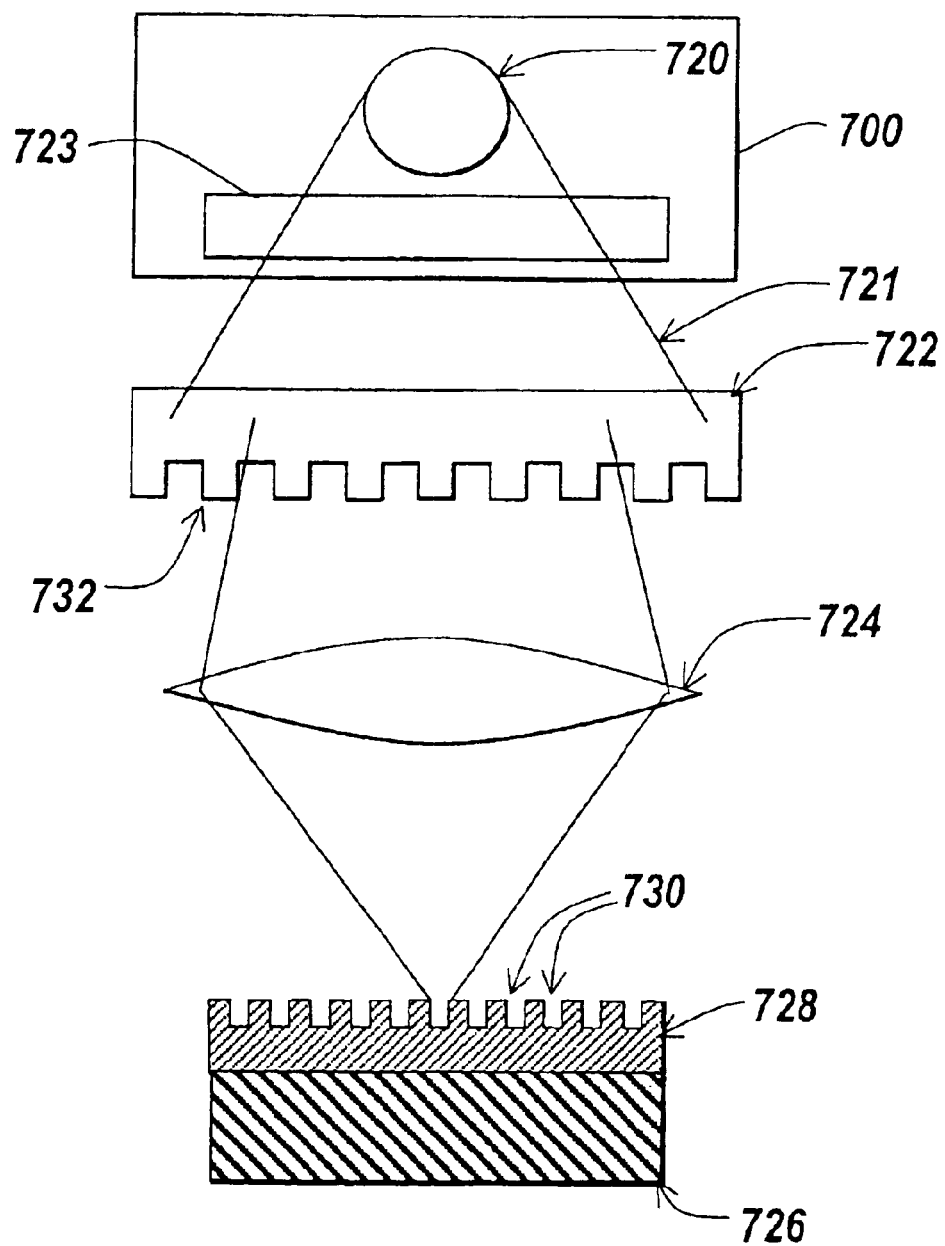
FIG. 17 is a block diagram illustrating an illumination source that varies the illumination parameters between subsequent exposures of the same mask according to the concepts of the present invention.

FIG. 17 is a schematic block diagram of the optical projection lithography apparatus according to the concepts of the present invention described above with respect to varying the illumination parameters between exposures of the same mask. The optical projection lithography apparatus of FIG. 17, according to the concepts of the present invention, includes an illuminator 700 having a light source 720 and an illumination parameter-modifying element 723. The optical projection lithography apparatus of FIG. 17 further includes a photomask 722 and reduction optics 724. A wafer 726 having a layer of photoresist 728 is presented to the optical projection lithography apparatus via a conventional substrate stage (not shown). The illuminator 700, using light-source 720 and illumination parameter-modifying element 723, generates a beam of light 721 that is operated upon the photomask 722 and reduction optics 724 to cause a pattern 730 to be exposed in the photoresist layer 728. In this manner, a pattern 732 provided on the mask 722 is transferred to the photoresist layer 728 on the wafer 726.

The illumination parameter-modifying element 723 provides the capability of changing the illumination parameters of the beam of light 721 coming from the illuminator 700 between exposures. It is noted that the illumination parameter-modifying element 723 may be a conventional optical element that enables the varying of the illuminator aperture parameters. Moreover, the illumination parameter-modifying element 723 may be a conventional optical element that provides the capability of differentiation in illumination wavefront magnitude, illumination wavefront phase, illumination wavefront partial coherence, illumination (shape or intensity), and/or illumination polarization. Lastly, the illumination parameter-modifying element 723 may be a phase shifting element so as to shift the created pattern in Cartesian space.

Moreover, the illumination parameter-modifying element 723 may include orthogonal dipole apertures or an illuminator-shaping element with a spatially varying phase. The spatially varying phase may be adjusted continuously or discretely. Lastly, the illumination parameter-modifying element 723 may include an aperture with movable parts.

It is further noted that the location of the illumination parameter-modifying element 723 in FIG. 17 is for illustration purposes only. The actual location of the illumination parameter-modifying element 723 in the optical path will depend on which parameter is actually be modified.

In an additional embodiment, the dense feature mask may be replaced with a template mask that may include dense features, isolated features, or any combination thereof.

In an additional embodiment, the trim mask steps S7 and S9 may be eliminated entirely, thus producing as a final product an untrimmed set of features. Such an application of the concepts of the present invention has numerous potential applications, such as in photonic structures.

In summary, in a particular embodiment according to the concepts of the present invention, a mask containing a two-dimensional array of dense contact features is used. To produce a well-balanced dense contact grid in the photoresist, two dipole illuminations are used in a double exposure, with the axes of the two dipoles being orthogonal to one another.

In other words, in the first exposure illumination, the two-dimensional dense feature array exposes the resist as if it were a one-dimensional grating in a first orientation, and in the second exposure illumination, this array exposes the resist as if it were a one-dimensional grating in a second orientation.

A subsequent trim exposure is used to produce a trimmed random contact pattern from the dense feature array.

In general, a wide range of useful patterns may be formed through the use of multiple illuminations of the same template mask, with different illumination parameters for each exposure of the template mask.

One advantage of the present invention is that the contrast and consistency benefits of using two one-dimensional gratings can be achieved while using only a single dense feature mask. A further advantage of the present invention is the decrease in fabrication time because changing the illuminator settings is often much faster than replacing a mask. Also, the present invention eliminates the alignment precision required in the exposure of two masks or a rotating mask.

Lastly, the present invention extends optical lithography resolution limits with respect to imaging a random contact array. The present invention may be readily inserted into an existing process, and in some cases, provide immediate throughput and/or resolution enhancement for manufacturers already using dense only contact lithography methods.

Although the various examples discussed above with respect to the present invention have utilized a phase-shift mask or equivalent structure, the concepts of the present invention are also readily applicable to other RET approaches. In other words, the thrust of the concepts of the present invention is directed to the formation of a desired image from the multiple exposure of the same feature photomask.

While the present invention has been particularly shown and described with references to preferred embodiments thereof, it will be understood by those skilled in the art that various changes in form and detail may be made herein without departing from the spirit and scope of the invention as defined by the appended claims.

What is claimed is:

1. A method of forming a feature pattern on a substrate, comprising:
   (a) exposing the substrate, using a mask having a pattern of features thereon, with an illuminator having a first set of settings, to produce an exposure resultant dense feature pattern on the substrate, the exposure resultant dense feature pattern having a predetermined pitch; and
   (b) exposing the substrate, using the same mask having the pattern of features thereon, with the illuminator having a second set of settings, the second set of settings being different from the first set of settings, to produce an exposure resultant dense feature pattern on the substrate, the exposure resultant dense feature pattern having a same predetermined pitch as the exposure resultant dense feature pattern produced by the illuminator having the first set of settings.

2. The method as claimed in claim 1, further comprising:
   (c) exposing the substrate to trim portions of the pattern on the substrate.

3. The method as claimed in claim 1, where the pattern of features corresponds to a template pattern of dense features.

4. The method as claimed in claim 1, wherein the mask having a pattern of features thereon remains stationary between the exposure of the substrate by the illuminator having the first set of settings and the exposure of the substrate by the illuminator having the second set of settings.

5. The method as claimed in claim 1, wherein the pattern of features is a pattern of regular dense features.

6. The method as claimed in claim 1, wherein the pattern of features is a pattern of dense features of a critical dimension.

7. The method as claimed in claim 1, wherein the pattern of features is a pattern of regular dense features of a predetermined pitch and critical dimension.

8. The method as claimed in claim 1, wherein the mask is a phase-shift mask.

9. The method as claimed in claim 8, wherein the phase-shift mask includes globally periodic features.

10. The method as claimed in claim 8, wherein the phase-shift mask includes locally periodic features.

11. The method as claimed in claim 8, wherein the phase-shift mask includes printable features, corresponding to features desired on the substrate, and sub-resolution features.

12. The method as claimed in claim 11, wherein the sub-resolution features of the phase-shift mask, when used to exposure the substrate, result in the formation of solid patterns on the substrate.

13. The method as claimed in claim 8, wherein the phase-shift mask includes optical proximity correction.

14. The method as claimed in claim 8, wherein the phase-shift mask includes spatial frequency correction.

15. The method as claimed in claim 1, wherein any exposure of the substrate consists of a sequence of sub-threshold and/or above threshold exposures.

16. The method as claimed in claim 15, in which a sub-threshold exposure is used to locally modify the critical dimension produced by exposing the substrate to provide a pattern of regular dense features.

17. The method as claimed in claim 1, wherein the mask is an attenuating phase-shift mask.

18. The method as claimed in claim 1, wherein the mask is a chrome mask.

19. The method as claimed in claim 1, wherein the first set of settings and the second set of settings differ in illuminator aperture design.

20. The method as claimed in claim 1, wherein the first set of settings and the second set of settings differ in illumination wavefront magnitude.

21. The method as claimed in claim 1, wherein the first set of settings and the second set of settings differ in illumination wavefront phase.

22. The method as claimed in claim 1, wherein the first set of settings and the second set of settings differ in illumination wavefront partial coherence.

23. The method as claimed in claim 1, wherein the first set of settings and the second set of settings differ in wavelength.

24. The method as claimed in claim 1, wherein the first set of settings and the second set of settings differ in polarization.

25. The method as claimed in claim 1, wherein the first set of settings includes using a phase shifter in the illuminator so as to shift the created pattern in Cartesian space.

26. The method as claimed in claim 1, wherein the second set of settings includes using a phase shifter in the illuminator so as to shift the created pattern in Cartesian space.

27. The method as claimed in claim 1, wherein the pattern of features is a pattern of dense holes.

28. The method as claimed in claim 1, wherein the pattern of features is a pattern of dense pillars.

29. The method as claimed in claim 1, further comprising exposing the substrate, using the same mask having the pattern of features thereon, with the illuminator having a third set of settings, the third set of settings being different from the first set of settings, to produce an exposure resultant dense fine feature pattern on the substrate, the exposure resultant dense feature pattern having a same predetermined pitch as the exposure resultant dense feature pattern produced by the illuminator having the first set of settings.

30. A method for defining multiple fine features in a resist, comprising:
   (a) exposing the substrate, using a mask having a pattern of features thereon, with an illuminator having a first set of settings, to produce an exposure resultant dense feature pattern on the substrate, the exposure resultant dense feature pattern having a predetermined pitch;
   (b) exposing the substrate, using the same mask having the pattern of features thereon, with the illuminator having a second set of settings, the second set of settings being different from the first set of settings, to produce an exposure resultant dense feature pattern on the substrate, the exposure resultant dense feature pattern having a same predetermined pitch as the exposure resultant dense feature pattern produced by the illuminator having the first set of settings; and
   (c) sub-threshold exposing the substrate using a gray-tone mask to locally partially expose different regions of the substrate, thereby allowing for a range of critical dimensions to be defined by the feature definition exposure.

31. The method as claimed in claim 30, wherein the gray-tone mask is a mask with sub-resolution features of varying pitch that produce a similar dose variation effect.

32. The method as claimed in claim 30, further comprising exposing the substrate, using the same mask having the pattern of features thereon, with the illuminator having a third set of settings, the third set of settings being different from the first set of settings, to produce an exposure resultant dense fine feature pattern on the substrate, the exposure resultant dense feature pattern having a same predetermined pitch as the exposure resultant dense feature pattern produced by the illuminator having the first set of settings.

33. A method of forming a feature pattern on a substrate, comprising:
(a) exposing the substrate, using a mask having a pattern of features thereon, with X-dipole illumination, to produce a dense feature illumination pattern on the substrate;
(b) exposing the substrate, using the same mask having the pattern of features thereon, with Y-dipole illumination, to produce a dense feature illumination pattern on the substrate; and
(c) exposing the substrate to trim portions of the pattern on the substrate.

34. The method as claimed in claim 33, wherein the mask having a pattern of features thereon remains stationary between the exposure of the substrate by the X-dipole illumination and the exposure of the substrate by Y-dipole illumination.

35. The method as claimed in claim 33, wherein the mask is a chrome mask.

36. The method as claimed in claim 33, wherein the pattern of features is a pattern of dense holes.

37. The method as claimed in claim 33, wherein the pattern of features is a pattern of dense pillars.

38. A method forming a feature pattern on a substrate, comprising:
(a) exposing the substrate, using a mask having a pattern of features thereon, with X-dipole illumination, to produce a dense feature illumination pattern on the substrate, the pattern of features of the mask corresponding to a template pattern of dense features; and
(b) exposing the substrate, using the same mask having the pattern of features thereon, with Y-dipole illumination, to produce a dense feature illumination pattern on the substrate.

39. The method as claimed in claim 38, wherein the pattern of features is a template pattern of regular dense features.

40. The method as claimed in claim 38, wherein the pattern of features is a template pattern of dense features of a predetermined pitch and critical dimension.

41. The method as claimed in claim 38, wherein the pattern of features is a template pattern of regular dense features of a predetermined pitch and critical dimension.

42. The method as claimed in claim 38, wherein the pattern of features is a template pattern of dense holes.

43. The method as claimed in claim 38, wherein the pattern of features is a template pattern of dense pillars.

44. A method of forming a feature pattern on a substrate, comprising:
(a) exposing the substrate, using a mask having a pattern of features thereon, with X-dipole illumination, to produce a dense feature illumination pattern on the substrate, the mask is being a phase-shift mask; and
(b) exposing the substrate, using the same mask having the pattern of features thereon, with Y-dipole illumination, to produce a dense feature illumination pattern on the substrate.

45. The method as claimed in claim 44, wherein the phase-shift mask includes globally periodic features.

46. The method as claimed in claim 44, wherein the phase-shift mask includes locally periodic features.

47. The method as claimed in claim 44, wherein the phase-shift mask includes printable features, corresponding to features desired on the substrate, and sub-resolution features.

48. The method as claimed in claim 47, wherein the sub-resolution features of the phase-shift mask, when used to expose the substrate, result in the formation of solid patterns on the substrate.

49. The method as claimed in claim 44, wherein the phase-shift mask includes optical proximity correction.

50. The method as claimed in claim 44, wherein the phase-shift mask includes spatial frequency correction.

51. A method of forming a feature pattern on a substrate, comprising:
(a) exposing the substrate, using a mask having a pattern of features thereon, with X-dipole illumination, to produce a dense feature illumination pattern on the substrate, the mask being an attenuating phase-shift mask; and
(b) exposing the substrate, using the same mask having the pattern of features thereon, with Y-dipole illumination, to produce a dense feature illumination pattern on the substrate.

52. A method of forming a feature pattern on a substrate, comprising:
(a) exposing the substrate, using a mask having a pattern of features thereon, with X-dipole illumination, to produce a dense feature illumination pattern on the substrate; and
(b) exposing the substrate, using the same mask having the pattern of features thereon, with Y-dipole illumination, to produce a dense feature illumination pattern on the substrate, the Y-dipole illumination using a phase shifter in a dipole illuminator so as to shift the created pattern in Cartesian space.

53. A method of forming a feature pattern on a substrate, comprising:
(a) exposing the substrate, using a mask having a pattern of features thereon, with X-dipole illumination, to produce a dense feature illumination pattern on the substrate, the X-dipole illumination using a phase shifter in a dipole illuminator so as to shift the created pattern in Cartesian space; and
(b) exposing the substrate, using the same mask having the pattern of features thereon, with Y-dipole illumination, to produce a dense feature illumination pattern on the substrate.

54. A method for defining multiple fine features in a resist, comprising:
(a) exposing the substrate, using a mask having a pattern of features thereon, with X-dipole illumination, to produce a dense fine feature illumination pattern on the substrate;
(b) exposing the substrate, using the same mask having the pattern of features thereon, with Y-dipole illumination, to produce a dense fine feature illumination pattern on the substrate; and
(c) sub-threshold exposing the substrate using a gray-tone mask to locally partially expose different regions of the substrate to modify critical dimensions of the fine features.

55. The method as claimed in claim 54, wherein the gray-tone mask is a mask with sub-resolution features of varying pitch that produce a similar dose variation effect.

56. A method for photolithographically forming a wide range of useful patterns, comprising:
(a) illuminating, with an illuminator, a same template mask multiple times, for each exposure of the same template mask, the illuminator having different illumination parameters, to produce an exposure resultant dense fine feature pattern on the substrate, each exposure resultant dense fine feature pattern having a same pitch.

57. The method as claimed in claim 56, wherein the different illumination parameters differ in illuminator aperture design.

58. The method as claimed in claim 56, wherein the different illumination parameters differ in illumination wavefront magnitude.

59. The method as claimed in claim 56, wherein the different illumination parameters differ in illumination wavefront phase.

60. The method as claimed in claim 56, wherein the different illumination parameters differ in illumination wavefront partial coherence.

61. The method as claimed in claim 56, wherein the different illumination parameters differ in wavelength.

62. The method as claimed in claim 56, wherein the different illumination parameters differ in polarization.

63. The method as claimed in claim 56, wherein the different illumination parameters differ by using a phase shifter in the illuminator so as to shift the created pattern in Cartesian space.

* * * * *